United States Patent
Pal et al.

(10) Patent No.: US 6,293,753 B1
(45) Date of Patent: Sep. 25, 2001

(54) AIR MOVING APPARATUS AND METHOD OF OPTIMIZING PERFORMANCE THEREOF

(75) Inventors: Debabrata Pal; Minoo Press, both of Schaumburg; Markus Dantinne, Round Lake, all of IL (US)

(73) Assignee: Motorola, Schaumburg, IL (US)

( * ) Notice: Subject to any disclaimer, the term of this patent is extended or adjusted under 35 U.S.C. 154(b) by 0 days.

(21) Appl. No.: 09/518,648

(22) Filed: Mar. 3, 2000

(51) Int. Cl.$^7$ ........................................ F01D 1/00
(52) U.S. Cl. ............................. 415/221; 415/914
(58) Field of Search ........................ 415/220, 221, 415/208.5, 914

(56) References Cited

U.S. PATENT DOCUMENTS

| | | | |
|---|---|---|---|
| 4,075,500 | * 2/1978 | Oman et al. | 415/914 X |
| 4,457,666 | * 7/1984 | Selman, Jr. | 415/203 |
| 6,164,911 | * 12/2000 | LeBlanc et al. | 415/228 |
| 6,183,196 | * 2/2001 | Fujinaka | 415/208.5 |

* cited by examiner

*Primary Examiner*—John E. Ryznic
(74) *Attorney, Agent, or Firm*—Jeffrey K. Jacobs

(57) ABSTRACT

An air moving device in the form of an axial flow fan is provided that is adapted for use in substantially enclosed high-density electrical systems, e.g. computers and the like. The fan includes an annular wall extending about the blades thereof and in which pressure equalizing openings are formed for increasing the maximum pressure in the preferred operating area of the fan and just before the stall effect occurs due to increasing system pressure resistance. A method is also provided for optimizing the number and size of the slots to obtain a desired maximum pressure increase. The slots are optimized so that there is no appreciable airflow loss in early stages of the preferred operating area while providing the desired increase in maximum pressure. The slots preferably have an elongated shape, e.g. rectangular or oval, with a major dimension extending generally axially and parallel to the axis of rotation of the blades, and are spaced from each other circumferentially about the annular wall.

13 Claims, 5 Drawing Sheets

AIR MOVING APPARATUS AND METHOD OF OPTIMIZING PERFORMANCE THEREOF

FIELD OF THE INVENTION

The present invention relates to an air moving apparatus and, more particularly, to fans for cooling electronic systems with improved performance and low-noise characteristics and a method for optimizing such fan characteristics.

BACKGROUND OF THE INVENTION

A wide variety of equipment and systems, such as portable and desktop computers, mainframe computers, communication infrastructure frames, automotive equipment, etc., include heat-generating components in their casings. One method used to remove heat from such equipment is to have a tube-axial fan draw air from exterior of the housing to blow cooling air over the heat-generating components. It has also been the trend to make electronic equipment more compact with the casings or housings therefor becoming smaller for consumer use and transport with highly complex circuits and miniaturized integrated electronic components used therewith, creating high-density electronic systems in the small casings. Thus, the heat generated in the casing can become relatively intense and requires high performance from the fan to meet the additional cooling demand.

A known problem that axial fans face relates to the amount of airflow that can be generated by the fan before the system resistance creates a static pressure drop or stall effect, especially in high-density applications. This typically is shown in a static pressure (P) vs. quantity of air flow (Q) graph plotting fan performance and system impedance pressure curves thereon. Greater heat load systems, such as the aforedescribed high density electronic systems, require a larger amount of airflow against high pressure drop to provide the desired cooling for the system. In such applications, this increased cooling demand is typically not available in an efficient manner from a conventional fan because of the relatively early stalling effect of the fan when it cannot overcome the pressure increasing in the system as it is being cooled.

More specifically, it is the section of the fan performance curve between the point where the static pressure is zero, and the point where the static pressure is at its peak value and before system pressure begins to reduce the static pressure from its maximum, which is the efficient or preferred operating area of the fan and which is desired to be maximized in terms of fan performance. At the high pressure end of the fan preferred operating area, the fan operation is in a "centrex region" which is an area proximate and at the intersection of both the fan performance and the system pressure curves. In the centrex region, as the output pressure from the fan drops with decreasing flow rate, the fan begins to show stall characteristics. Fan operation in the centrex region is in a highly unstable and inefficient manner. As flow reduces and output pressure increases after the centrex region, the fan operates in a highly turbulent region and mixed mode of operation which can increase vibrations and power requirements for the fan.

A known method to meet higher heat loads is to employ multiple fans aligned in series in a push/pull configuration. The series multiple-fan system has the ability to raise the maximum pressure before stall. The shortcomings with series multiple fans include the increased space necessary for incorporating multiple fans into the smaller casings of high density electronic system and the additional power requirements. Space requirements in electronic devices such as microsite communication infrastructure systems are of paramount importance, and accordingly space allocation for an additional fan may not be feasible. Multiple fans also produce an increased level of noise which is undesirable, particularly where the fans are incorporated into consumer devices. At the bottom line, the cost associated with multiple fans is also increased.

U.S. Pat. No. 5,707,205 discloses a fan with a special construction including annular plates disposed about the fan blades and spaced axially by an optimum amount to improve flow. The fan of the '205 patent with the annular plate construction is disclosed as improving the so-called P-Q characteristic of the fan but has been found to lack the desired airflow in the preferred operating area of the fan (i.e., from zero static pressure to the maximum pressure before stall) and specifically at lower pressures thereof because of the oversized nature of the circumferentially extending spaces between adjacent plates.

Thus, there is a need for an improved air moving device, such as a fan used to cool high-density electronic systems, that has an increased maximum pressure before the stall effect. Further, a fan would be desirable that does not reduce airflow in the preferred operating area. Also, it is desired that the fan be able to be incorporated into the smaller housing including high density electronic systems therein in a cost-effective manner and without creating excessive noise.

DETAILED DESCRIPTION OF THE PREFERRED EMBODIMENTS

Figure 1:
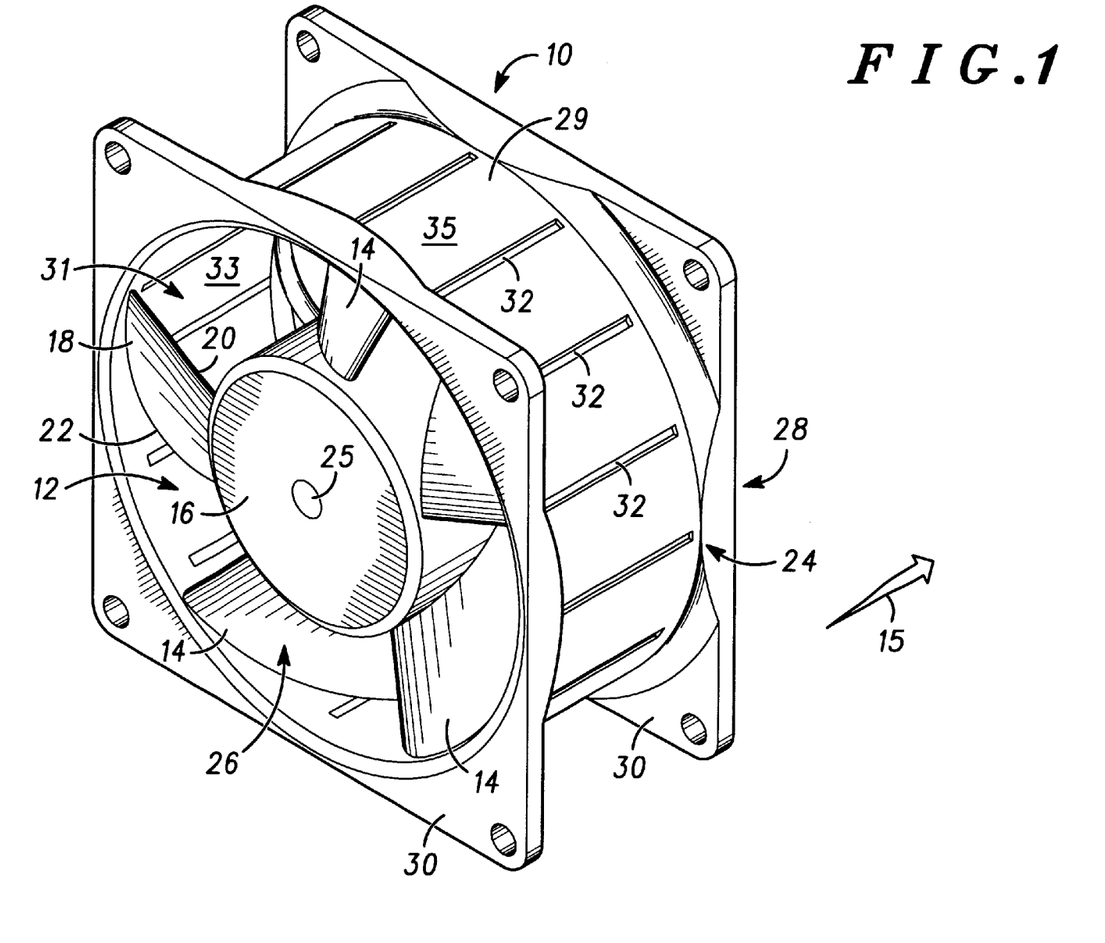
FIG. 1 is a perspective view of an air moving apparatus in accordance with the present invention showing a tube-axial fan including a shroud about blades of the fan with slots formed therein.

Referring to FIG. 1, there is illustrated an air moving apparatus in the form of an tube-axial fan 10 in accordance with the present invention having an increased maximum pressure in the preferred operating area via the provision of a predetermined number and size of pressure-equalizing openings 32 in housing 24 for the fan 10. The number and size of the openings 32 can be predetermined to optimize the fan performance in accordance with the desired increase in maximum pressure before stall with the method of the invention. These openings 32 are effective to increase the peak pressure before the centrex effect occurs thus delaying the stalling dip caused thereby and the onset of inefficient fan operation. At the same time, the area of the openings 32 is such that loss of airflow at lower pressures in the efficient operating area of the fan 10 is minimized. Thus, the present fan 10 provides for performance enhancements at the high end of its preferred operating area without sacrificing performance at the low end of this preferred range of operation. In this manner, the present fan 10 finds high utility in those applications where the heat load on the fan is excessive, i.e. small casings enclosing high density electronics therein.

More particularly, the fan 10 includes a propeller 12 with fan blades 14 extending generally radially outward from a hub 16. Each fan blade 14 terminates at a tip end portion 18 thereof radially spaced from the hub 16 and has a leading edge 20 and a trailing edge 22 extending between the hub 16 and the tip end portion 18. The propeller 12 is mounted for rotation in the fan housing 24 and is rotatively driven by an output shaft of a motor (not shown) which also can be mounted in the housing 24. The motor rotates the propeller 12 about a central longitudinal axis 25 to cause the fan blades 14 to draw air from an inlet side 26 of the fan 10 and to impart velocity to discharge the air from an outlet side 28 of the fan 10 in an axial direction indicated by arrow 15.

The housing 24 includes an annular wall or shroud 29 that extends about the propeller 12 adjacent the tip end portions 18 of the blades 14 to form a fan annulus region 31. The shroud 29 has an interior surface 33 and an exterior surface 35. In the illustrated and preferred form, the shroud 29 is tubular and cooperates with the fan blades 14 to direct airflow through the fan 10 in the axial direction 15 and, as a result, causes a pressure differential between the inlet side 26 and the outlet side 28 of the fan 10. The housing 24 can also include mounting flanges 30 at either axial end of the tubular shroud 29 to be used for mounting the fan 10 in a desired system for cooling.

To increase the maximum output pressure of the fan 10 in the preferred operating area (i.e.,before stall), a number of through openings 32 which are illustrated in the form of slots are formed in the shroud 29 to provide passages extending through and between the shroud surfaces 33 and 35 to allow for communication between the annulus region 31 in the housing 24 and the external surrounding of the fan 10 such as that of a casing for a portable or desktop computer in which the fan housing 24 is mounted. As explained in further detail below, the number and size of the slots 32 can be precisely predetermined to provide the required equalization of the pressure between the annulus region 31 at the tip end portions 18 of the fan blades 14 and the pressure closer to the fan hub 16 for the performance desired of the fan 10.

Figure 5:
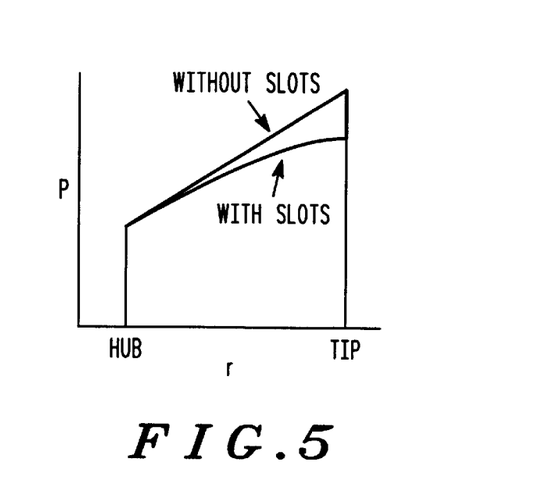
FIG. 5 is a graph illustrating curves showing the effect of system pressure along the fan blades from the hub of the fan blade propeller to the tip region of the fan blade for both a conventional fan and a fan incorporating features of the present invention.

During operation of the fan 10, the fan blades 14 create a separation of air flow near the tip 18 of the blades 14 so that there is a boundary layer of air at the tip portions 18 of the blades 14. The reduction of pressure variations between the hub 16 and the blade tip portions 18 afforded by the openings 32 of the present invention (see FIG. 5) reduces the flow separation over the fan blades 14 near the tip end portions 18. More specifically, the performance of the fan 10 herein is increased by allowing for a flow bypass from the fan shroud annulus region 31 to generate pressure equalization along the blades 14. For an axial flow fan such as the present fan 10, the total pressure in the fan annulus 31 will normally increase from the hub 16 to the tip portions 18 of the blades 14. However, with the present slot openings 32 formed in the shroud wall 29, it has been found that the total pressure at these blade tip portions 18 will be reduced. The pressure reduction on the blades 14 near their tip portions 18 has a highly stabilizing effect on the boundary layer thereat. The stabilizing effect is generated by displacement of the point of maximum boundary thickness toward the trailing edges 22 of the blades 14 which delays flow separation near the tip portions 18. As the flow separation is delayed, the prevention of transition and hence the stall effect on the fan blades 14 is also delayed. Thus, an increase in the maximum pressure before stall is achieved. Accordingly, the reduction of flow separation increases the maximum pressure before stall and reduces the magnitude of the low end pressure caused by the stall effect. Overall, the desired increase in maximum pressure can be achieved in a highly controlled manner by appropriately selecting the number and size of the slots 32 disposed about the fan shroud 29, as more fully described hereinafter.

Figure 2:
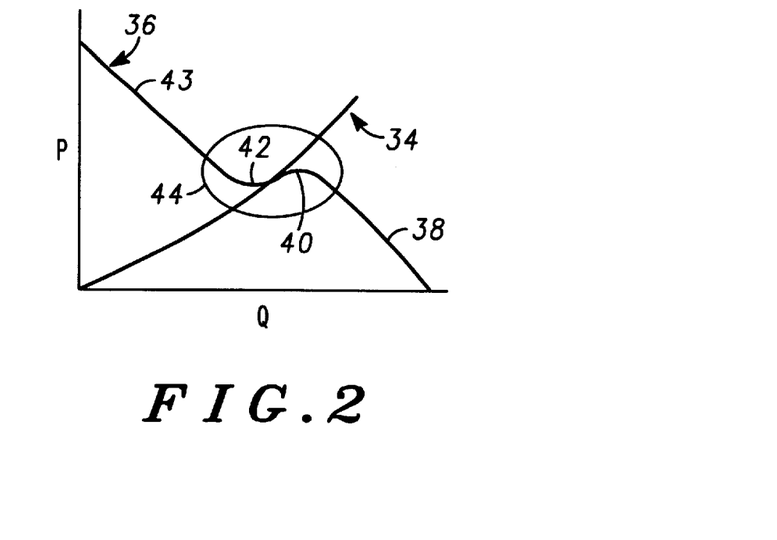
FIG. 2 is a graph illustrating a system curve and a conventional fan performance curve plotted from the characteristics of pressure versus air flow.

Turning next to the graph of FIG. 2, a system impedance curve 34 and a fan performance curve 36 of a conventional axial fan with a housing lacking the present pressure-equalizing openings 32 are plotted by pressure (P) versus airflow (Q). Moving right from P=0 along the system curve 34, the pressure in the system increases with volume of airflow into the system. Fan performance is traced moving from P=0 along the fan performance curve 36. More specifically, the first segment 38 of the fan performance curve 36, between P=0 and a peak 40, depicts the preferred operating area for the fan 10. The peak 40 represents the maximum pressure of the fan 10 immediately prior to where the fan begins to stall as a result of the pressure from the system.

Continuing along the fan performance curve 36, a dip 42 follows the peak 40 where the slope of the curve 36 becomes positive, which represents the decrease in pressure output from the fan 10. The dip region 42 illustrates the stalling effect on the fan 10. The final segment 43 after the dip region 42 illustrates that the fan output pressure increases with a reduction in airflow. However, this increase is provided as a result of the fan operating in an inefficient mixed flow mode and with the fan producing additional noise due to unstable operation thereof. In other words, instead of airflow across the blades 14 being generated so that air travels in the axial direction 15, a progressively increasing radial component of airflow along the blades becomes prevalent along the blades.

Figure 4:
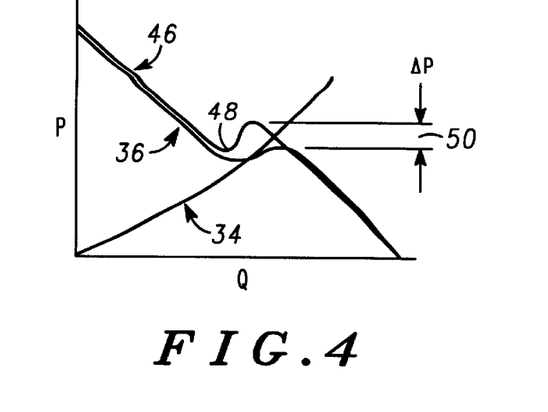
FIG. 4 is a graph illustrating the system curve and the conventional fan performance curve of FIG. 2 and a fan performance curve for the fan of FIG. 1 showing its increase in maximum pressure in the preferred operating area thereof.

The graphical region surrounding the intersection of the system curve 34 with the fan performance curve 36 in the dip region 42 is referred to as the "centrex region" as indicated by the oval area on the graph of FIG. 2 marked with reference number 44. The centrex region 44 is where the fan 10 begins to stall and operate at a low efficiency rate and at an increased noise level. As discussed, the fan housing openings 32 of the present invention reduces the pressure variation between the annulus region 31 at the tip end portions 18 of the fan blades 14 and the hub 16 to increase the maximum pressure before the stall dip 42 in the centrex region 44, as shown by the graph of FIG. 4. The performance curve 46 is juxtaposed with the conventional fan performance curve 36 of FIG. 2. The improved fan operation curve 46 is shifted upward so that the system curve 34 does not intersect the stall region 48 of the curve 46, and as a result, the primary effect of the centrex region is avoided. The differential in the maximum pressure ($\Delta P$) between that of the present fan 10 and the conventional fan is denoted with reference number 50 with the higher maximum pressure of the fan 10 allowing it to operate under larger system resistance. In other words, the present fan 10 is better suited for use in housings having high density electrical systems therein where the heat loading and cooling demands placed on a fan are greater.

Figure 3:
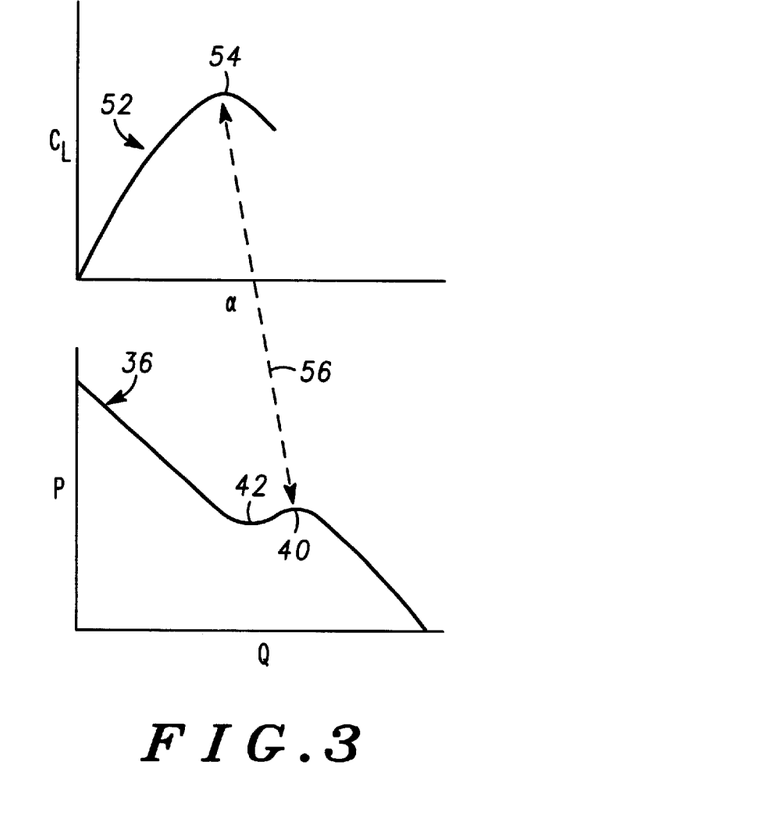
FIG. 3 is two graphs for comparison with the upper graph illustrating the characteristics of fan blade coefficient of lift versus air angle of attack on the airfoil blades, and the lower graph reproducing the fan performance curve similar to the graph of FIG. 2.

In FIG. 3, two graphs are arranged for comparing the coefficient of lift of the fan blades with the overall performance of the prior fan. More particularly, the curve 52 of the upper graph plots the coefficient of lift, $C_L$, of the fan blades 14 versus the angle, ∝, at which the air attacks the fan blades 14 (see FIG. 6). The lower graph shows the fan performance curve 36 of FIG. 2. The importance of lift is that it contributes directly to the amount of pressure generated by the fan. Fan blades are designed to generate lift as they are rotated, which results in generation of pressure difference across the fan (i.e. ambient lower pressure vs. higher internal system pressure).

As illustrated in the upper graph of FIG. 3, lift coefficient, $C_L$, depends on the angle of attack, ∝. The lift coefficient curve 52 has a peak 54 that depicts the maximum lift. This maximum corresponds to the peak 40 for the maximum pressure on the fan performance curve 36 of the lower graph. This is indicated by the arrow denoted by reference number 56 extending between the curves.

As earlier mentioned, the first segment 38 of the fan operation curve 36 represents the preferred operating area of the fan. This corresponds to the lift coefficient curve 52 to the left of the lift coefficient peak 54. To the right of the lift coefficient peak 54, the fan begins to produce less lift and, thus, less overall pressure, as can be seen in the dip region 42 on the fan performance curve 36 in the lower chart. This effect is due to the increase in pressure resistance from the system being cooled.

Figure 6:
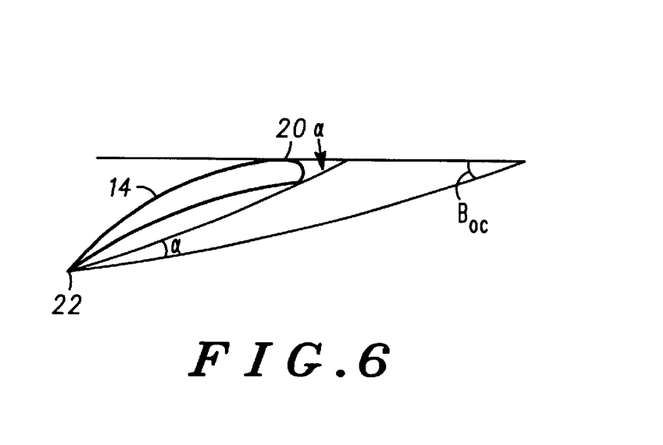
FIG. 6 is a cross-sectional view of an airfoil fan blade to show the relevant angles of airflow and blade orientation.

In other words and referencing FIG. 6, in a fan as the average angle of airflow, β∞, past the blades 14 decreases with increased pressure in the system being cooled, the angle of attack, ∝, of air on the blades increases. When the angle, ∝, reaches the value corresponding to the maximum lift coefficient, $C_L$, the fan begins to stall. As a further result, the pressure and flow across the blades separates and becomes more mixed and turbulent, with an increase in the radial or drag direction. Consequently, the fan produces more noise. In the dip portion 42, the flow separation can become so severe that the fan becomes highly inefficient in operation and requires more power to negate the system resistance.

With the addition of slots 32, the velocity head or dynamic pressure at the output of the fan before stall increases, as previously explained. Therefore, the critical angle of attack (i.e., the angle of attack corresponding to the maximum lift coefficient) is reached at a relatively higher pressure in the system. This results in an increase of the maximum pressure of the fan 10 in the efficient operating range thereof by way of delaying the stall effect. In other words, the flow separation across the blades 14 and, in particular, at the tip end portion 18 of each blade 14, is reduced. Thus, the primary effect of the centrex region is avoided as illustrated in FIG. 4, and as a result, the stall effect is delayed, and the maximum pressure is increased.

As discussed above, to increase the maximum pressure before stall, the pressure between the tip end portion 18 of the fan blades 14 and the hub 16 of the fan 10 is brought closer to an equalized state by providing slots 32 extending through the shroud 29 of the fan housing 24 defining the annulus region 31. As illustrated, the slots 32 are preferably equally spaced circumferentially about the shroud 29 extending in alignment and parallel with the fan rotary axis 25 or askew therefrom as described below and can have a rectangular shape. Manifestly, the slots may have other shapes, such as other elongated types of configurations, e.g. oval, in accordance with the invention herein. Employing the present slots 32 is also advantageous in terms of manufacture of the fans 10 herein as they do not require major design modification to the basic structure of a conventional fan, and instead the structure of a conventional fan can be used with the only modification being the need to form the through openings 32 in the shroud wall 29 that is already present.

In addition, while the illustrated rectangular slots 32 extend with their major dimension, i.e., length, oriented in a straight line fore and aft direction identical to the axis 25 of rotation for the propeller 12, the length of the slots 32 also can be disposed at an angle or skewed with respect to the fore and aft direction. In this regard, the angular orientation of the slots 32 can be defined by a plane of rotation of the blades 14 normal to the axis 25 of rotation and the angle, γ, of disposition for the tip portions 18 of blades 14 relative to the rotation plane. The slot angular orientation also is to be disposed in the direction opposite of the direction of the propeller rotation. For instance, if the tip end portions 18 are angled at about 30° with respect to the plane of rotation, the slots 32 can be disposed in a predetermined angular range from an axial orientation of about 90°, where they extend axially normal to the plane of rotation in alignment with the fan rotary axis 25, to an angled orientation of approximately 120°, where they extend at a 30° angle to the plane of rotation but in a direction 90° askew from that of the tip end portions 18 and opposite to the fan rotation direction. In all instances, whether the slots 32 extend perfectly axially or are angled from the axial direction as described above, the major dimension of the slots 32 extends in a direction transverse to the plane of rotation.

As earlier mentioned, the desired increase in maximum pressure is dependent on the number and size of the slots 32 disposed about the shroud 29. The desired improvement in the maximum pressure is correlated with the physical parameters of the fan, fan speed and the area provided by the slots. It has been found to be important that the number and size of the slots 32 be not so great so as to cause problems with airflow during early stages of the efficient operating range of the fan 10 as with the previously-described prior fan, and also be of sufficient number and area to achieve the desired pressure equalization based on the physical and operating characteristics of the fan 10, as more fully described below.

The following design correlation is preferably used to determine the slot area and the number of slots 32. With the desired maximum pressure differential being ΔP, the fan shroud diameter being D, the rotational speed being N (rpm), the fan blade tip speed (U) and density of air (ρ), the corresponding dimensionless change can be expressed as ΔΨ, where $$\Delta\Psi = \frac{\Delta P}{\frac{1}{2}\rho u^2} \quad (1)$$

The fan blade tip speed is defined as:

$$u = \frac{\pi DN}{60} \quad (2)$$

Figure 7:
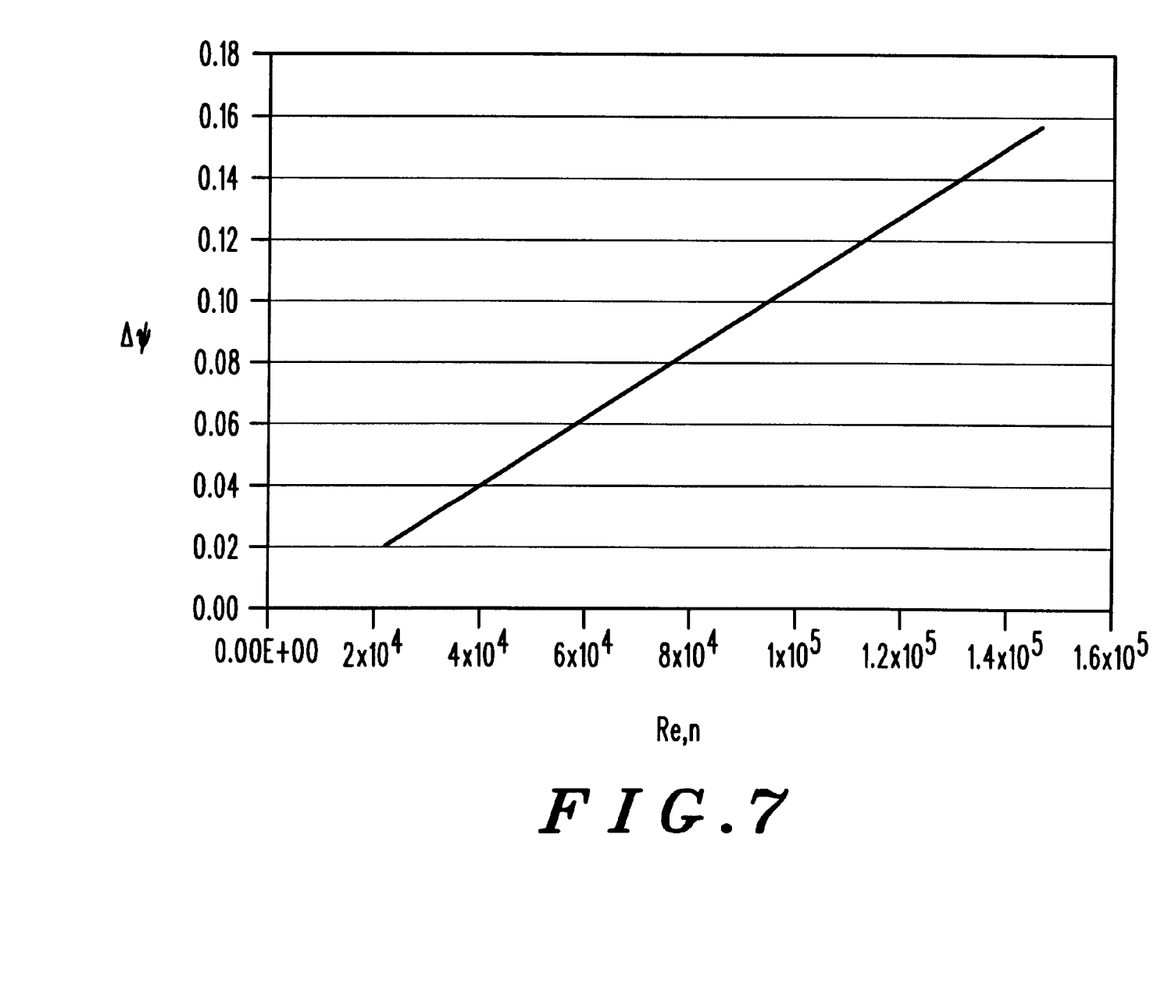
FIG. 7 is a graph plotting the principle design equation to show the effect of the slot Reynolds number multiplied by number of the slots (Re·n) versus a dimensionless increase in pressure before stall ($\Delta\Psi$)

The change in pressure coefficient ($\Delta\Psi$) is expressed, as a function of Reynolds number (Re) and number of slots (n), as:

$$\Delta\Psi = m(Re \cdot n) + K \quad (3)$$

where $m = 1.1 \times 10^{-6}$, $K = -0.00266$ and, $$Re = \frac{\rho u D_h}{\mu} \quad (4)$$

Where $\mu$ is the coefficient of dynamic viscosity of, in this instance, air. The term $D_h$ is the hydraulic diameter of the slot, which is expressed as:

$$D_h = \frac{2tl}{t+l}, \quad (5)$$

where, t, is the dimension of the slots 32 in the peripheral or circumferential direction, i.e. slot width, and, l, the dimension of the slots 32 in the axial direction 25, i.e. slot length. The dimension in the axial direction, l, may be generally known from the depth of the fan. For example, in the preferred and illustrated form, the slot length is the entire axial length of the shroud 29. Equation (3) represents the main design equation which expresses the relationship between the desired pressure increase, the number of slots and the size of the slots. The effect of this design equation is illustrated in FIG. 7 plotting ($\Delta\Psi$) versus the number of slots times the Reynolds number. As shown, an increase in the number calculated by multiplying the number of slots 32 with the Reynolds number corresponds to a linear or proportional increase in the change in pressure coefficient, $\Delta\Psi$.

In addition to the above correlations, the number of slots 32 should be integer multiples of (b−1) where b is the number of blades 14. For example, for a fan 10 with five blades 14, the desired number of slots can be 4, 8, 12, 16, etc. Equal numbers of blades 14 and slot openings 32 has been found to produce blade pass tones during operation of the fan that creates undesirable noise. Further, the Reynolds number, Re, should be equal to or less than the critical Re, which is 5,000 to avoid noise problems.

Based on the foregoing, a fan designer determines the desired maximum pressure at which they would like the fan 10 to be able to operate. This allows the calculation for equation (1) to be performed as $\Delta P$ is based on the differential in maximum pressure, and the remaining variables, u, and $\rho$, are known with, u, determined from equation (2) consisting of known variables. With the pressure coefficient, the designer can refer to the graph of FIG. 7 to find the value for the number of slots 32 multiplied by the Reynolds number. To determine the Reynolds number, Re, the designer should start with the minimum number of slots 32 based on the limitation imposed by the number of fan blades 14 and compare the so calculated Reynolds number with the critical Reynolds number. If the Reynolds number exceeds the critical number, then the number of slots 32 should be increased to the next multiple and so forth until the Reynolds number is below the critical value. Then, assuming the length of the slots 32 to equal that of the shroud wall 29, equations (4) and (5) can be combined to solve for the width, t, of the slots 32. Accordingly, the equations (1)–(5) allow a designer using the FIG. 7 graph to determine the necessary number of slots 32 along with their size and, in particular, their width to achieve a desired maximum pressure over that achieved with a similarly constructed conventional fan without the slots 32 of the present invention.

Figure 8:
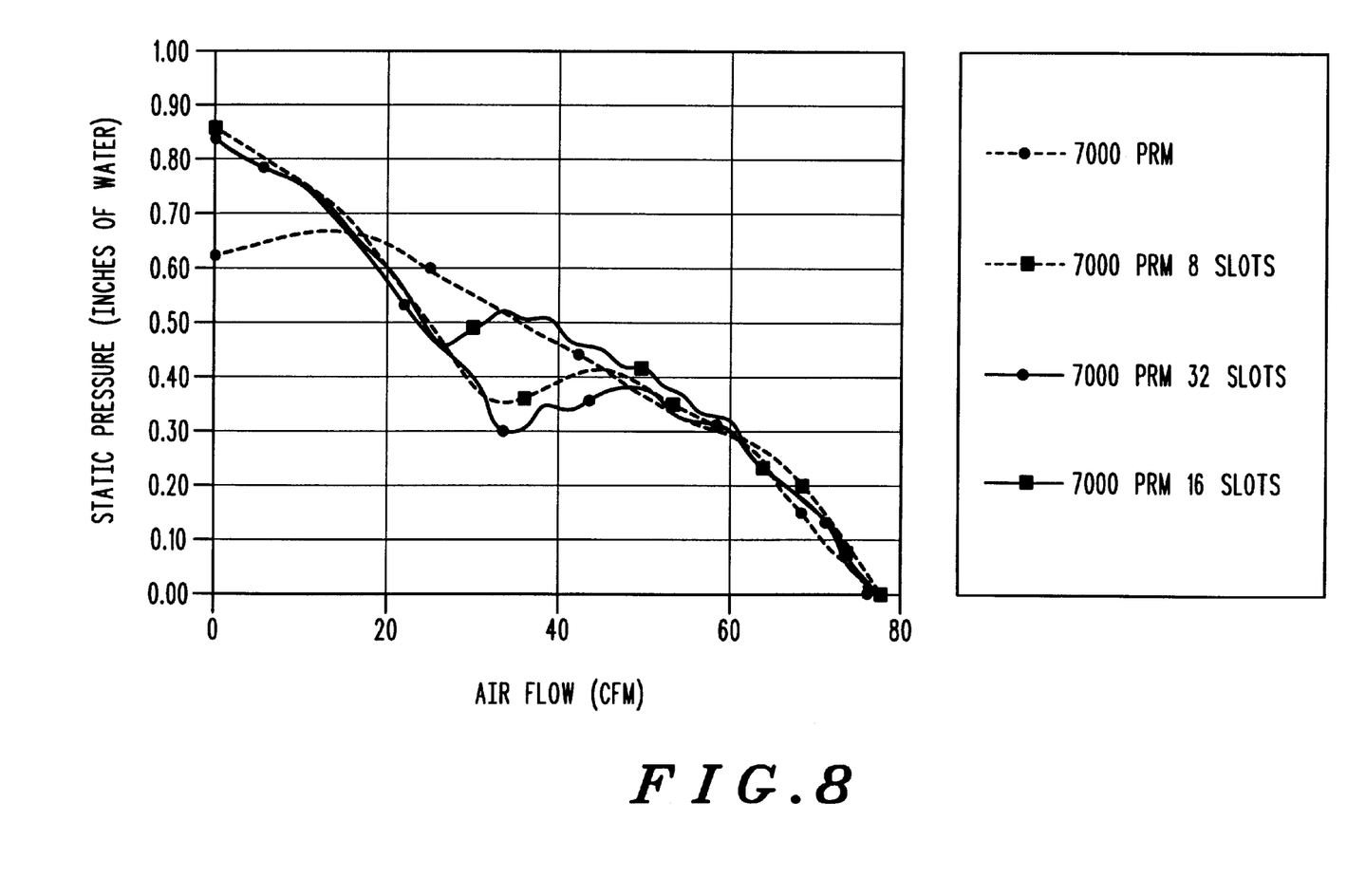
FIG. 8 is a graph illustrating fan performance curves for fans incorporating different numbers of slots.

As an example, the improvement provided by the equalization of pressure through the elongated slots 32 is shown in FIG. 8. The three curves represent the performance of three eighty millimeter fans (outer shroud diameter) having eight slots, sixteen slots and thirty-two slots and operating at 7000 RM. The fourth curve represents a fan without slots for comparison. As can be seen the maximum pressure of each of the slotted fans 10 is increased over the unslotted fan. Further, no appreciable air flow loss is caused by the slotted fans 10 in comparison to the unslotted fan at the lower pressure ranges in the preferred operating area thereof. It is also noted that with each doubling of the number of the slots 32, the point at which maximum pressure was obtained increased as shifted to the left on the graph indicating lower airflows at the higher maximum pressure. This effect is most dramatic when the number of slots 32 is increased from sixteen to thirty-two as the maximum pressure rises from approximately 0.52 inches of water to approximately 0.67 inches of water while airflow drops from approximately 33 CFM to approximately 15 CFM.

In other testing with the illustrated slotted fan 10 of FIG. 1, at a low speed, such as 4000 RPM, the maximum pressure before stall increases from 0.12 inches of water to 0.14 inches of water. As the fan speed increased, the realized gain in performance enhances. For instance, at 6200 RPM, the maximum pressure before stall increases from 0.3 to 0.34 inches of water, and at 7000 RPM, the maximum pressure before stall increases from 0.39 to 0.49 inches of water. The axially oriented slots 32 in the illustrated fan 10 are 1.5 mm in width and have a length of 23 mm, which is the full length of the shroud 29, with the shroud diameter being approximately 73.8 mm and the five blades 14 having a radius from hub 16 to tip ends 18 thereof of approximately 16.4 mm. As is apparent, the above sizing for the slots 32 leaves the majority of the shroud wall 29 intact so that the relatively small overall area for the through openings they provide does not diminish airflow at lower operating pressures of the fan 10 while providing a sufficient amount of communication between the annulus 31 and the exterior of the housing 27 to reduce pressure differential between the hub and blade tip portions for providing the desired maximum pressure and thus delay with respect to the onset of the stall effect. Accordingly, the present fan 10 provides for maximized performance levels throughout its preferred operating area lending itself for use in high heat load applications.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

We claim:

1. An air moving apparatus for generating cooling air flow in an enclosure including heat generating components, the air moving apparatus having a preferred operating area of output pressures and corresponding air flows and comprising:

a fan housing;

a fan having a rotatable hub and plurality of blades mounted to the hub for rotation about an axis of rotation to provide pressurized airflow out from the housing in the enclosure;

an annular wall of the housing extending about tip end portions of the blades and generally directing airflow out from the housing in an axial direction along the fan rotary axis, there being a pressure differential between higher pressures at the tip end portions of the blades and the fan hub; and through openings in the annular wall having a predetermined area relative to that of the annular wall to minimize said pressure differential for increasing maximum pressure by a predetermined amount and minimizing loss of airflow at low pressures in the preferred operating area of the fan, wherein the through openings include elongated openings having a length extending parallel to the axis of rotation.

2. An air moving apparatus for generating cooling air flow in an enclosure including heat generating components, the air moving apparatus having a preferred operating area of output pressures and corresponding air flows and comprising:

a fan housing;

a fan having a rotatable hub and plurality of blades mounted to the hub for rotation about an axis of rotation to provide pressurized airflow out from the housing in the enclosure;

an annular wall of the housing extending about tip end portions of the blades and generally directing airflow out from the housing in an axial direction along the fan rotary axis, there being a pressure differential between higher pressures at the tip end portions of the blades and the fan hub; and through openings in the annular wall having a predetermined area relative to that of the annular wall to minimize said pressure differential for increasing maximum pressure by a predetermined amount and minimizing loss of airflow at low pressures in the preferred operating area of the fan, wherein the fan blades rotate in a plane of rotation, the fan rotary axis extends normal to the plane of rotation, and the through openings are sized to include a major dimension that extends transverse to the plane of rotation.

3. The air moving apparatus of claim 1 wherein the through openings are spaced circumferentially about the annular wall.

4. The air moving apparatus of claim 3 wherein the through openings are equally spaced circumferentially about the annular wall.

5. The air moving apparatus of claim 1 wherein the through openings are slots having a rectangular shape with a length and a width thereof.

6. The air moving apparatus of claim 5 wherein the slot length is oriented in a predetermined angular range between an axial orientation in alignment with the rotary axis and an angled orientation askew from the rotary axis and extending oppositely to the direction in which the fan blades rotate.

7. In a fan having a plurality of blades that rotate in a housing about an axis of rotation, the housing having an annular wall about the blades, the fan comprising:

slot openings in the annular wall extending axially generally parallel to the fan rotary axis and sized to provide a desired differential in maximum pressure over that provided by a conventional fan having an unslotted annular wall, the slots having an axial length substantially equal to that of the annular wall, the slots having a Reynolds number not too exceed a predetermined critical Reynolds number;

a pressure coefficient for the maximum pressure differential having a predetermined relationship with the number of slots multiplied by the Reynolds number so that the number of slots can be determined to avoid exceeding the critical Reynolds number; and a width of the slots having a predetermined relationship with the Reynolds number to allow the slot width to be predetermined to achieve the desired maximum pressure differential.

8. The fan of claim 7 wherein the fan has a predetermined number of blades, b, and the number of slots is an integer multiple of (b−1) to allow the slot number to vary so that the critical Reynolds number is not exceeded for a desired maximum pressure differential.

9. The fan of claim 7 wherein the critical Reynolds number is 5,000.

10. The fan of claim 7 wherein the pressure coefficient, $\Delta\Psi$, is derived from the equation, $$\Delta\Psi = \frac{\Delta P}{\frac{1}{2}\rho u^2},$$

where $\rho$ is the density of air and u is the fan blade tip speed defined as, $$u = \frac{\pi D N}{60},$$

where D is a diameter of the annular wall and N is fan rotational speed, the pressure coefficient predetermined relationship with the Reynolds number, Re, multiplied by the number of slots, n, is, $\Delta\Psi=m(\text{Re}\cdot n)+K$ where $m=1.1\times10^6$ and $K=-0.00266$, and the slot width, t, predetermined relationship with the Reynolds number being, $$Re = \frac{\rho u D_h}{\mu}$$

where $\mu$ is the coefficient of dynamic viscosity of air and $$D_h = \frac{2tl}{t+l},$$

where, l, is the slot length.

11. A method of optimizing the performance of an axial flow fan having an efficient operating range thereof, the method comprising:

providing a fan housing having an annular wall extending about a predetermined number of blades of the fan with pressure equalizing slot openings in the wall spaced from each other in a circumferential direction thereabout;

selecting one of a plurality of predetermined numbers of slot openings for obtaining a desired maximum pressure in the efficient operating range of the fan, the selected one of the plurality of predetermined slot numbers rendering a Reynolds number for the slots that is less than a predetermined critical Reynolds number;

deriving a predetermined width in the circumferential direction for the slots based on the rendered Reynolds number, wherein the one of the plurality of predetermined numbers of slots is selected by deriving an initial minimum number of slots and calculating a first Reynolds number therewith, comparing the calculated first Reynolds number to the critical Reynolds number, and, if the calculated Reynolds number is greater, deriving a second higher number of slots having a predetermined relationship with the initially derived minimum number of slots and calculating a second Reynolds number therewith, comparing the calculated second Reynolds to the critical Reynolds number, and repeating the deriving of slot numbers, calculating of Reynolds numbers, and comparing to the critical Reynolds number until a Reynolds number is calculated that is less than the critical Reynolds number to determine the number of slots that will be used to provide the desired maximum pressure, and wherein the initial minimum number of slots, is derived by subtracting (1) one from the predetermined number of fan blades, b, and the higher numbers of slots are calculated by multiplying (b−1) by successive numbers greater than (1) one until the Reynolds number is below the critical Reynolds number;

sizing the slots in the annular wall so that the slots extend axially along their length for the full axial distance of the wall;

deriving a pressure coefficient based on the desired maximum pressure increase; and deriving a number corresponding to the number of slots multiplied by a Reynolds number based on a predetermined relationship with the pressure coefficient to allow the slot number to be varied until said rendered Reynolds number below the critical Reynolds number is achieved keeping the derived number constant to maintain the derived pressure coefficient the same for obtaining the desired maximum pressure increase.

12. The method of claim 11 wherein the pressure coefficient, )Θ, is derived by calculating, $$\Delta\Psi = \frac{\Delta P}{\frac{1}{2}\rho u^2},$$

where )P is the desired maximum pressure increase, Δ is the density of air and u is the fan blade tip speed defined as, $$u = \frac{\pi DN}{60},$$

where D is a diameter of the annular wall and N is fan rotational speed, the number corresponding to the number of slots multiplied by the slot Reynolds number, Re, is derived by calculating, )Θ=m(Re·n)+K, where m=1.1×10$^6$ and K=−0.00266, the width of the slots, t, based on a predetermined relationship with the Reynolds number is derived by calculating, $$Re = \frac{\rho u D_h}{\mu},$$

where: is the coefficient of dynamic viscosity of air and $$D_h = \frac{2tl}{t+l},$$

where, l, is the length of the slot.

13. The method of claim 11 wherein the critical Reynolds number is 5,000.

* * * * *